US012665278B2

(12) United States Patent
Kim et al.

(10) Patent No.: US 12,665,278 B2
(45) Date of Patent: Jun. 23, 2026

(54) TRANSVERSE MAGNETIC MODE SPLIT POST DIELECTRIC RESONATOR

(71) Applicant: The Curators of the University of Missouri, Columbia, MO (US)

(72) Inventors: DongHyun Kim, Rolla, MO (US); Xiaoning Ye, Portland, OR (US); Chaofeng Li, Rolla, MO (US)

(73) Assignee: The Curators of the University of Missouri, Columbia, MO (US)

( * ) Notice: Subject to any disclaimer, the term of this patent is extended or adjusted under 35 U.S.C. 154(b) by 199 days.

(21) Appl. No.: 18/724,406

(22) PCT Filed: Dec. 28, 2021

(86) PCT No.: PCT/US2021/065387
§ 371 (c)(1),
(2) Date: Jun. 26, 2024

(87) PCT Pub. No.: WO2023/129140
PCT Pub. Date: Jul. 6, 2023

(65) Prior Publication Data
US 2025/0070443 A1 Feb. 27, 2025

(51) Int. Cl.
*H01P 7/06* (2006.01)
*G01R 27/26* (2006.01)
*G01R 31/28* (2006.01)
(52) U.S. Cl.
CPC ............ *H01P 7/06* (2013.01); *G01R 27/2658* (2013.01); *G01R 31/2805* (2013.01)

(58) Field of Classification Search
CPC .... H01P 7/06; G01R 27/2658; G01R 31/2805
See application file for complete search history.

(56) References Cited

U.S. PATENT DOCUMENTS

| | | | | |
|---|---|---|---|---|
| 4,996,489 | A * | 2/1991 | Sinclair | ............... G01R 27/267 |
| | | | | 324/639 |
| 6,222,428 | B1 * | 4/2001 | Akesson | ................... H01P 7/10 |
| | | | | 333/219.1 |
| 6,496,018 | B1 * | 12/2002 | Nagata | ................... G01N 22/00 |
| | | | | 324/636 |

(Continued)

FOREIGN PATENT DOCUMENTS

| | | |
|---|---|---|
| KR | 10-2014-0083055 A | 7/2014 |
| KR | 10-2016-0002074 | 1/2016 |

OTHER PUBLICATIONS

International Search Report and Written Opinion mailed Sep. 23, 2022 in corresponding PCT/US2021/065387, 8 pages.

(Continued)

*Primary Examiner* — Paresh Patel
(74) *Attorney, Agent, or Firm* — HOVEY WILLIAMS LLP

(57) ABSTRACT
A device for measuring a property of a substrate comprises an enclosure, two resonators, and two probes. The substrate has a top surface, and the enclosure defines a cavity for placing the substrate. The resonators extend into the cavity of the enclosure. The probes extend into the cavity, and each of the probes comprises a loop that extends about an axis that is substantially parallel to the top surface of the substrate so that the probes are operable to excite a transverse magnetic mode signal in the cavity.

26 Claims, 4 Drawing Sheets

(56)         References Cited

U.S. PATENT DOCUMENTS

| | | | |
|---|---|---|---|
| 7,602,193 B1 * | 10/2009 | Baird ................. | G01R 27/2658 |
| | | | 324/636 |
| 2003/0231086 A1 * | 12/2003 | Ishikawa ............... | H01P 1/2084 |
| | | | 333/219.1 |
| 2004/0246079 A1 * | 12/2004 | Ehata ........................ | H01P 7/06 |
| | | | 333/219.2 |
| 2005/0093555 A1 * | 5/2005 | Ehata ........................ | H01P 7/06 |
| | | | 702/50 |
| 2014/0354969 A1 | 12/2014 | Elings et al. | |
| 2016/0123899 A1 * | 5/2016 | Harrison ................ | G01N 22/04 |
| | | | 324/636 |
| 2016/0313653 A1 | 10/2016 | Mink et al. | |
| 2019/0113400 A1 | 4/2019 | Pillars et al. | |
| 2019/0154439 A1 | 5/2019 | Binder | |

OTHER PUBLICATIONS

International Preliminary Report on Patentability mailed Jul. 11, 2024 in corresponding PCT/US2021/065387, 7 pages.
Machine Translation of KR20160002074, 15 pages.

* cited by examiner

TRANSVERSE MAGNETIC MODE SPLIT POST DIELECTRIC RESONATOR

STATEMENT REGARDING FEDERALLY-SPONSORED RESEARCH OR DEVELOPMENT

This invention was made with Government support under Contract No.: NSF IIP1916535 awarded by the United States National Science Foundation. The Government has certain rights in the invention.

RELATED APPLICATION

The present application claims priority to PCT International Patent Application No. PCT/US2021/065387, filed Dec. 28, 2021, which is incorporated by reference in its entirety herein.

BACKGROUND

Dielectric properties of a substrate, such as a board of a printed circuit board (PCB), are required for modeling behavior of circuits on the substrate. Current solutions for determining the dielectric properties of the substrate involve placing the substrate in a split post dielectric resonator with probes having loops therein that extend about axes that are perpendicular to upper and lower surfaces of the substrate. The probes are configured to introduce a transverse electric (TE) mode signal into the resonator. The responsive signal is analyzed and used to determine the dielectric properties of the substrate. However, an electromagnetic (EM) field excited by the loops does not represent the real electric field distribution with PCB routing. Therefore, a model of a circuit utilizing such dielectric properties will not be consistent with real behavior for all real applications with non-isotropic and inhomogeneous dielectric materials, which the majority of PCB dielectric materials are non-isotropic and inhomogeneous.

The background discussion is intended to provide information related to the present invention which is not necessarily prior art.

SUMMARY OF THE INVENTION

The present invention solves the above-described problems and other problems by providing devices, systems, and methods for measuring a property of a substrate.

A device constructed according to an embodiment of the present invention is provided for measuring a property of a substrate having a top surface. The device comprises an enclosure, two resonators, and two probes. The enclosure defines a cavity for placing the substrate, and the resonators extend into the cavity of the enclosure.

The probes extend into the cavity, and each of the probes comprises a loop that extends about an axis that is substantially parallel to the top surface of the substrate so that the probes are operable to excite a transverse magnetic (TM) mode signal in the cavity. By exciting a TM mode signal, properties such as effective permittivity and loss tangent of the substrate may be determined more accurately and account for any inhomogeneous aspects of the substrate.

A method of measuring an effective permittivity and loss tangent of a substrate according to an embodiment of the present invention broadly comprises exciting a transverse-magnetic mode signal, via two or more loop probes that extend about axes that are parallel to a top surface of the substrate, in an enclosure containing the substrate; detecting, via two or more dielectric resonators, a responsive signal in the enclosure; and determining the property of the substrate based at least in part on the responsive signal.

A system constructed according to another embodiment of the present invention measures an effective permittivity and loss tangent of an inhomogeneous substrate having a top surface. The system broadly comprises an enclosure, two resonators, two probes, a network analyzer, and a processing element. The enclosure defines a cavity for placing the substrate, and the resonators extend into the cavity of the enclosure. The probes extend into the cavity, and each of the probes comprises a loop that extends about an axis that is substantially parallel to the top surface of the substrate so that the probes are operable to excite a TM mode signal in the cavity.

The network analyzer is in communication with the resonators and is configured to excite a TM mode signal, via the two or more probes, in the cavity, and detect, via the two or more resonators, a responsive signal in the enclosure. The processing element is configured to determine the effective permittivity and the loss tangent of the substrate based at least in part on the responsive signal. By exciting the TM mode signal, the effective permittivity and loss tangent are more accurately representing EM field distribution within the non-isotropic and inhomogeneous dielectric materials, which is true for the majority of dielectrics used in PCBs.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present invention will be apparent from the following detailed description of the embodiments and the accompanying drawing figures.

BRIEF DESCRIPTION OF THE DRAWING FIGURES

Embodiments of the present invention are described in detail below with reference to the attached drawing figures, wherein.

Figures 1, 2:
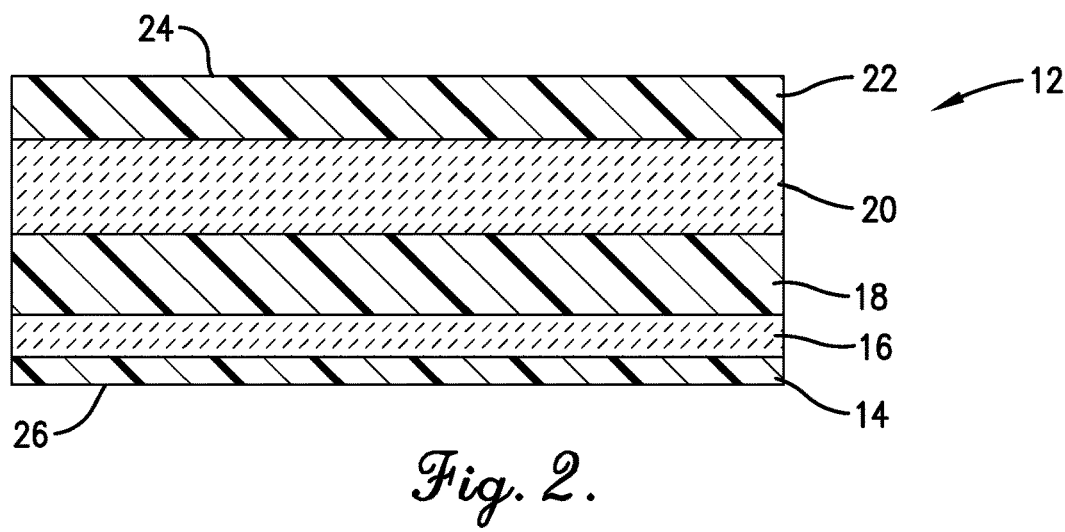
FIG. 1 is a block diagram depicting selected components of a system constructed in accordance with embodiments of the present invention.
FIG. 2 is a sectional view of a substrate placed in the system of FIG. 1.

The drawing figures do not limit the present invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the present technology can include a variety of combinations and/or integrations of the embodiments described herein.

Turning to FIG. 1, a system 10 constructed in accordance with an embodiment of the invention is illustrated. The illustrated system 10 is configured to determine properties of a substrate using a TM mode signal. The properties may be dielectric properties, such as an effective permittivity or loss tangent of the substrate. The substrate may be an inhomogeneous substrate made of multiple materials.

For example, FIG. 2 depicts a substrate 12 may be made of a plurality of layers of material 14, 16, 18, 20, 22. The layers 14, 18, 22 may be made of resin having, for example, an effective permittivity of 2.8 and a loss tangent of 0.001 at 1 GHz. The layers 16, 20 may be made of glass (mixed with some resin) and have, for example, an effective permittivity of 5.5 and a loss tangent of 0.002 at 1 GHz. Further, the layers 14, 16, 18, 20, 22 may have different thicknesses. For example, layer 14 may have a thickness of 1 millimeter (mm), layer 16 may have a thickness of 1.5 mm, layer 18 may have a thickness of 3.2 mm, layer 20 may have a thickness of 3.5 mm, and layer 22 may have a thickness of 2 mm. The substrate 12 may be a board of a PCB or the like and may have a top surface 24 and a bottom surface 26 opposing the top surface 24.

Figure 3:
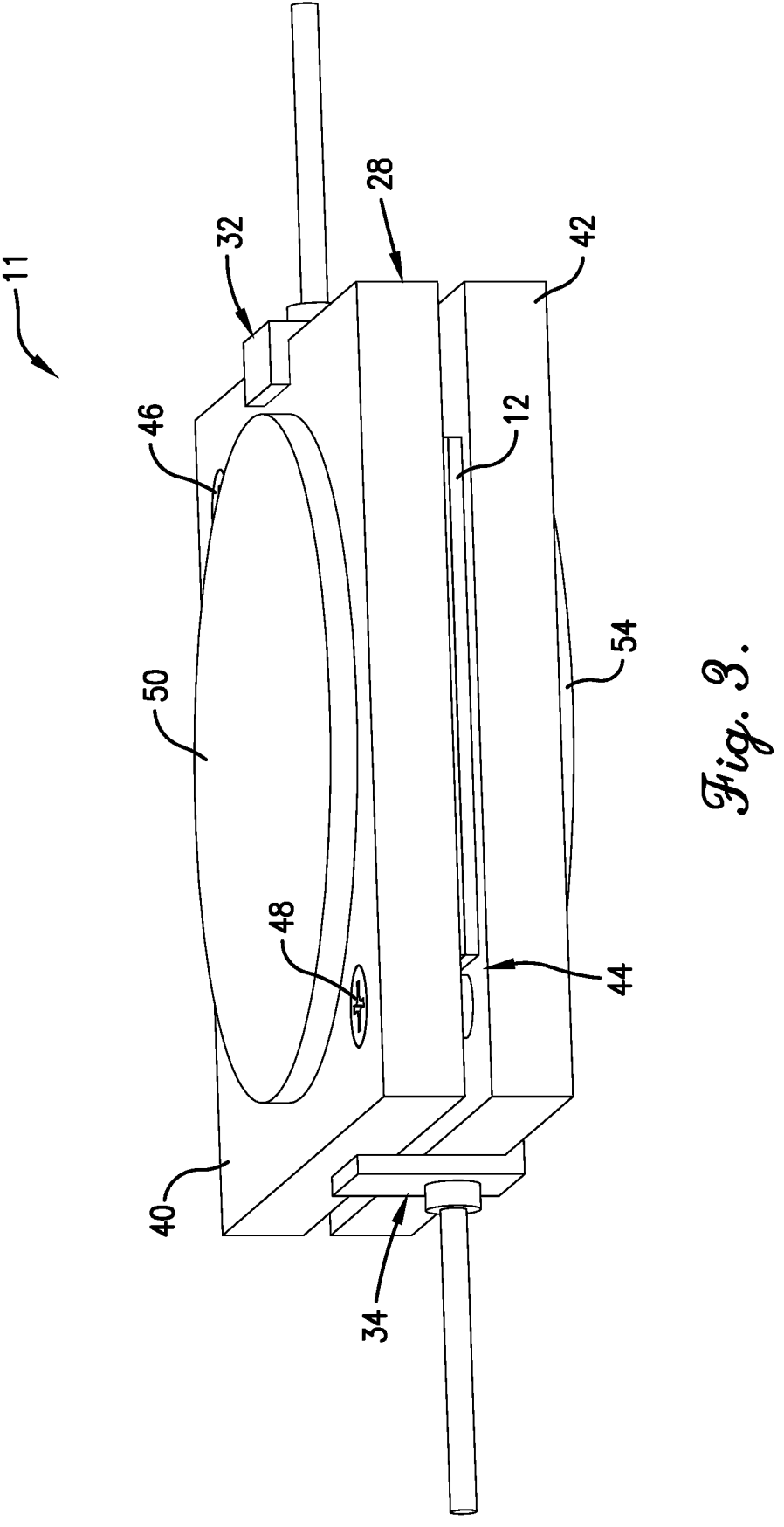
FIG. 3 is a perspective view of a resonator device of the system of FIG. 1.

Turning back to FIG. 1, the system 10 may comprise a resonator device 11, a network analyzer 35, and a controller 36. Turning to FIG. 3, the device 11 is operable to excite a TM mode signal about the substrate 12 and receive a responsive signal. The device 11 may be a TM split post dielectric resonator and comprise an enclosure 28, two or more resonators 30, 31, and two or more probes 32, 34.

The enclosure 28 defines a cavity 38 (depicted in FIG. 4) for placing the substrate 12 and may comprise an upper portion 40 spaced apart from a lower portion 42 to form a gap 44 for receiving the substrate 12 into the cavity 38. The enclosure 28 may include a first fastener 46 and a second fastener 48 extending between the upper portion 40 and the lower portion 42. The fasteners 46, 48 are operable to adjust a distance between the upper portion 40 and the lower portion 42.

The upper portion 40 may comprise an upward extending cylinder 50 defining a cylindrical upper space 52 (depicted in FIG. 4) of the cavity 38, and the lower portion 42 comprises a downward extending cylinder 54 defining a cylindrical lower space 56 (depicted in FIG. 4) of the cavity 38. The upper portion 40 and the lower portion 42 may be made of metal.

Figure 4:
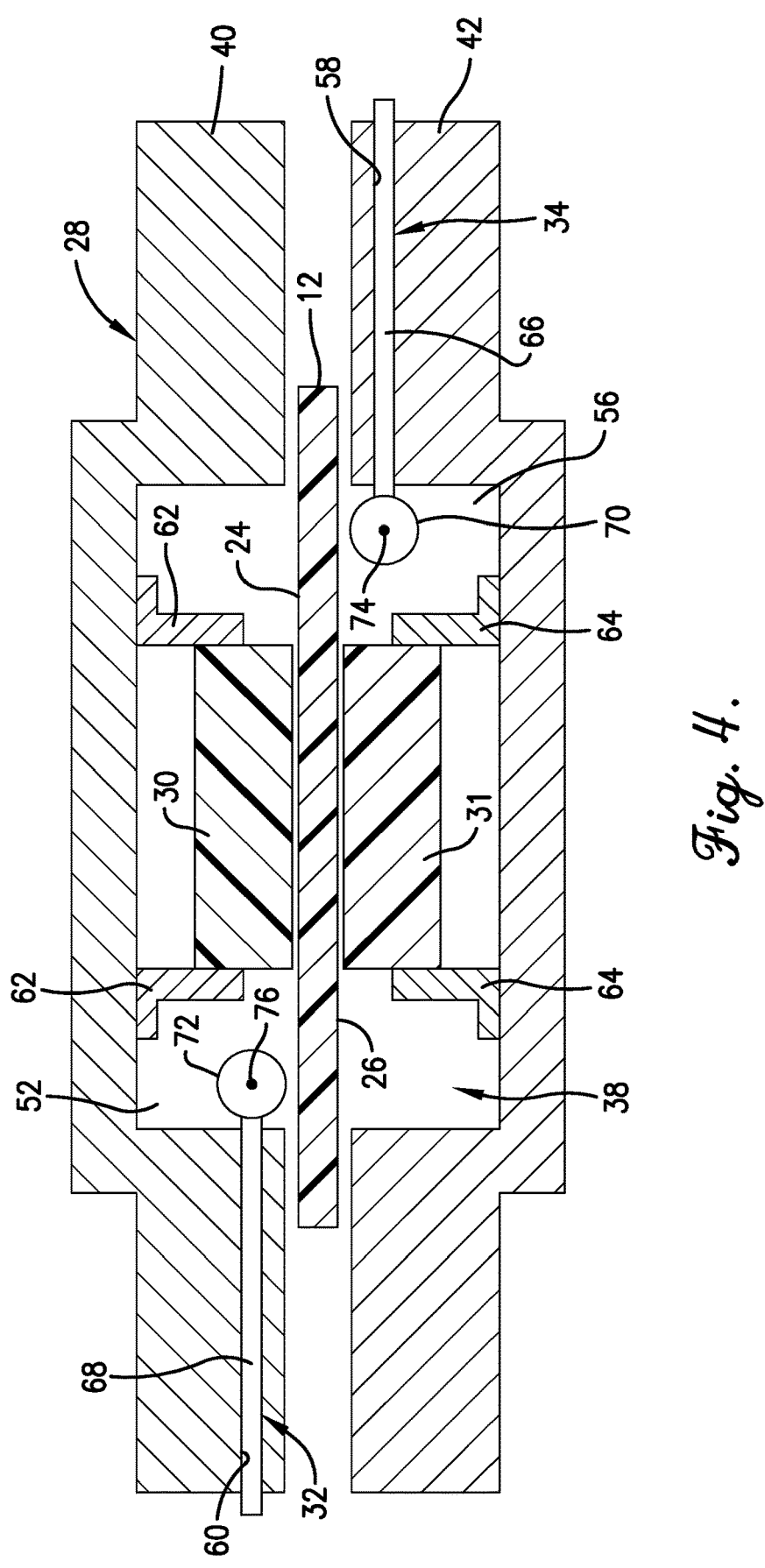
FIG. 4 is a sectional view of the device of FIG. 3.

Turning to FIG. 4, the enclosure 28 may comprise two or more channels 58, 60 for receiving the probes 32, 34. The enclosure 28 may also comprise supports 62, 64 for supporting the resonators 30, 31 in the cavity 38. The supports 62, 64 may be made of dielectric material for isolating the resonators 30, 31 from the metal upper portion 40 and the lower portion 42.

The resonators 30, 31 are operable to detect signals inside the cavity 38. The resonators 30, 31 may be secured to the supports 62, 64 and extend into the cavity 38 of the enclosure 28. In some embodiments, the resonators 30, 31 are dielectric resonators.

The probes 32, 34 are operable to excite a TM mode signal in the cavity 38. The probes 32, 34 may include elongated portions 66, 68 that extend through the channels 58, 60 of the enclosure 28 and loops 70, 72 that extend into the cavity 38. The loops 70, 72 extend about axes 74, 76 that are substantially parallel to the top and bottom surfaces 24, 26 of the substrate 12 so that the probes 32, 34 are operable to excite TM mode signals in the cavity 38. As depicted in FIG. 4, the imaginary axes 74, 76 extend out of the page.

Turning back to FIG. 1, the network analyzer 35 is configured to excite a TM mode signal in the cavity via the probes 32, 34 and detect the responsive signal via the resonators 30, 31. The network analyzer 35 may be configured to excite the TM mode signal in the cavity via the probes 32, 34 when the substrate is not in the enclosure. The network analyzer 35 may detect a base responsive signal within the enclosure via the resonators 30, 31 and determine a base Q-factor and a base resonant frequency of the enclosure based on the detected base responsive signal. The network analyzer 35 may be configured to excite the TM mode signal in the cavity via the probes 32, 34 when the substrate is placed in the enclosure. The network analyzer 35 may then detect an adjusted responsive signal within the enclosure via the resonators 30, 31. The responsive signal is adjusted because it is affected by the presence of the substrate in the enclosure. The network analyzer 35 may be configured to determine an adjusted Q-factor and an adjusted resonant frequency of the enclosure based on the detected adjusted responsive signal.

The controller 36 is in communication with the network analyzer 35 and is configured to determine an electrical property of the substrate 12 based at least in part on the Q-factor and resonant frequency determinations from the network analyzer 35. The controller 36 may comprise a communication element 78, a memory element 80, and a processing element 82. The communication element 78 may generally allow communication with systems or devices external to the controller 36, such as the network analyzer 35. The communication element 78 may include signal or data transmitting and receiving circuits, such as antennas, amplifiers, filters, mixers, oscillators, digital signal processors (DSPs), and the like. The communication element 78 may establish communication wirelessly by utilizing RF signals and/or data that comply with communication standards such as cellular 2G, 3G, 4G, 5G, or LTE, WiFi, WiMAX, Bluetooth®, BLE, or combinations thereof. The communication element 78 may be in communication with the processing element 82 and the memory element 80.

The memory element 80 may include data storage components, such as read-only memory (ROM), programmable ROM, erasable programmable ROM, random-access memory (RAM) such as static RAM (SRAM) or dynamic RAM (DRAM), cache memory, hard disks, floppy disks, optical disks, flash memory, thumb drives, universal serial bus (USB) drives, or the like, or combinations thereof. In some embodiments, the memory element 80 may be embedded in, or packaged in the same package as, the processing element 82. The memory element 80 may include, or may constitute, a "computer-readable medium". The memory element 80 may store the instructions, code, code segments, software, firmware, programs, applications, apps, services, daemons, or the like that are executed by the processing element 82.

The processing element 82 may include processors, microprocessors (single-core and multi-core), microcontrollers, DSPs, field-programmable gate arrays (FPGAs), analog and/or digital application-specific integrated circuits (ASICs), or the like, or combinations thereof. The processing element 82 may generally execute, process, or run instructions, code, code segments, software, firmware, programs, applications, apps, processes, services, daemons, or the like. The processing element 82 may also include hardware components such as finite-state machines, sequential and combinational logic, and other electronic circuits that can perform the functions necessary for the operation of the current invention. The processing element 82 may be in communication with the other electronic components through serial or parallel links that include address busses, data busses, control lines, and the like.

For example, the processing element 82 of the controller 36 may be in communication with the network analyzer 35. The processing element 82 may be in communication with the above components via the communication element 78 and/or direct wiring. The processing element 82 of the controller 36 may be configured to send and/or receive information to and/or from the above components. The processing element 82 of the controller 36 may also be configured to send and/or receive commands to and/or from the above components.

The processing element 82 may be configured to receive the base Q-factor, the base resonant frequency, the adjusted Q-factor, and the adjusted resonant frequency to determine the effective permittivity and the loss tangent of the substrate. For example, for the substrate 12 described in association with FIG. 2, current solutions of modeling dielectric properties of substrates would determine an effective permittivity of 3.985 and a loss tangent of 0.0013 at 20 GHz. Embodiments of the present invention would determine an effective permittivity of 3.585 and a loss tangent of 0.00131 at 20 GHz. The effective permittivity and loss tangent as determined by the present invention enables much more accurate modeling and prediction of circuit behavior on a measured substrate at higher frequencies, such as frequencies above about 10 GHz, above about 20 GHz, or above about 30 GHz. The accuracy is improved because the formula for calculating the impedance using TE mode signals is shown in Equation 1 below, whereas the formula for calculating the impedance using TM mode signals is shown in Equation 2 below. Equation 2 accounts for representative EM distribution with the inhomogeneous aspects of the substrate 12.

$$Z_w = \frac{\omega \mu_0}{\beta_z} \tag{1}$$

$$Z_w = \frac{\int_S \frac{|\vec{E}_x + \vec{E}_y|}{|\vec{H}_y|}}{2S} \tag{2}$$

Figure 5:
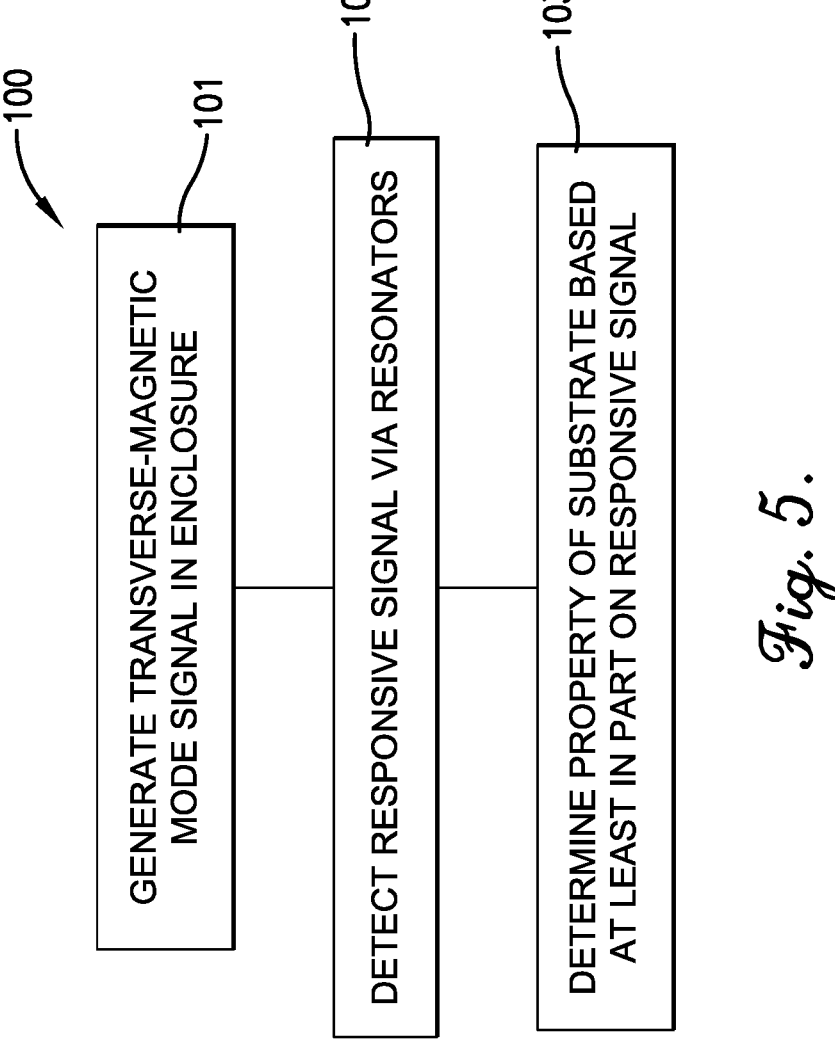
FIG. 5 is a flowchart depicting exemplary steps of a method according to an embodiment of the present invention.

The flow chart of FIG. 5 depicts the steps of an exemplary method 100 of measuring a property of a substrate. In some alternative implementations, the functions noted in the various blocks may occur out of the order depicted in FIG. 5. For example, two blocks shown in succession in FIG. 5 may in fact be executed substantially concurrently, or the blocks may sometimes be executed in the reverse order depending upon the functionality involved. In addition, some steps may be optional.

The method 100 is described below, for ease of reference, as being executed by exemplary devices and components introduced with the embodiments illustrated in FIGS. 1-4. The steps of the method 100 may be performed by the controller 36 through the utilization of processors, transceivers, hardware, software, firmware, or combinations thereof. However, some of such actions may be distributed differently among such devices or other devices without departing from the spirit of the present invention. Control of the system may also be partially implemented with computer programs stored on one or more computer-readable medium (s). The computer-readable medium(s) may include one or more executable programs stored thereon, wherein the program(s) instruct one or more processing elements to perform all or certain of the steps outlined herein. The program(s) stored on the computer-readable medium(s) may instruct processing element(s) to perform additional, fewer, or alternative actions, including those discussed elsewhere herein.

Referring to step 101, a TM mode signal is excited in an enclosure. The TM mode signal may be induced via two or more loop probes. The probes may include loops that extend about axes that are parallel to a top surface of the substrate. This step may include inducing the TM mode signal in the enclosure when the substrate is positioned therein. This step may also include inducing the TM mode signal in the enclosure without the substrate. This step may also include adjusting the fasteners to affect the size of the cavity defined by the enclosure.

Referring to step 102, a responsive signal in the enclosure may be detected via two or more dielectric resonators. The responsive signal may be detected via a network analyzer connected to the resonators. The responsive signal may be a base responsive signal when excited in the enclosure without the substrate. The responsive signal may be an adjusted signal when excited in the enclosure when the substrate is placed therein.

Referring to step 103, the property of the substrate may be determined based at least in part on the responsive signal. The property may the effective permittivity and loss tangent of the substrate. The property may be determined based on the base resonant frequency, the base Q-factor, the adjusted resonant frequency, and the adjusted Q-factor. The property may be determined via the processing element of the controller that receives signals representative of the base resonant frequency, the base Q-factor, the adjusted resonant frequency, and the adjusted Q-factor.

The method 100 may include additional, less, or alternate steps and/or device(s), including those discussed elsewhere herein.

ADDITIONAL CONSIDERATIONS

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments but is not necessarily included. Thus, the current technology can include a variety of combinations and/or integrations of the embodiments described herein.

Although the present application sets forth a detailed description of numerous different embodiments, it should be understood that the legal scope of the description is defined by the words of the claims set forth in any subsequent regular utility patent application. The detailed description is to be construed as exemplary only and does not describe every possible embodiment since describing every possible embodiment would be impractical. Numerous alternative embodiments may be implemented, using either current technology or technology developed after the filing date of this patent, which would still fall within the scope of the claims.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of routines, subroutines, applications, or instructions. These may constitute either software (e.g., code embodied on a machine-readable medium or in a transmission signal) or hardware. In hardware, the routines, etc., are tangible units capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as computer hardware that operates to perform certain operations as described herein.

In various embodiments, computer hardware, such as a processing element, may be implemented as special purpose or as general purpose. For example, the processing element may comprise dedicated circuitry or logic that is permanently configured, such as an application-specific integrated circuit (ASIC), or indefinitely configured, such as an FPGA, to perform certain operations. The processing element may also comprise programmable logic or circuitry (e.g., as encompassed within a general-purpose processor or other programmable processor) that is temporarily configured by software to perform certain operations. It will be appreciated that the decision to implement the processing element as special purpose, in dedicated and permanently configured circuitry, or as general purpose (e.g., configured by software) may be driven by cost and time considerations.

Accordingly, the term "processing element" or equivalents should be understood to encompass a tangible entity, be that an entity that is physically constructed, permanently configured (e.g., hardwired), or temporarily configured (e.g., programmed) to operate in a certain manner or to perform certain operations described herein. Considering embodiments in which the processing element is temporarily configured (e.g., programmed), each of the processing elements need not be configured or instantiated at any one instance in time. For example, where the processing element comprises a general-purpose processor configured using software, the general-purpose processor may be configured as respective different processing elements at different times. Software may accordingly configure the processing element to constitute a particular hardware configuration at one instance of time and to constitute a different hardware configuration at a different instance of time.

Computer hardware components, such as communication elements, memory elements, processing elements, and the like, may provide information to, and receive information from, other computer hardware components. Accordingly, the described computer hardware components may be regarded as being communicatively coupled. Where multiple of such computer hardware components exist contemporaneously, communications may be achieved through signal transmission (e.g., over appropriate circuits and buses) that connect the computer hardware components. In embodiments in which multiple computer hardware components are configured or instantiated at different times, communications between such computer hardware components may be achieved, for example, through the storage and retrieval of information in memory structures to which the multiple computer hardware components have access. For example, one computer hardware component may perform an operation and store the output of that operation in a memory device to which it is communicatively coupled. A further computer hardware component may then, at a later time, access the memory device to retrieve and process the stored output. Computer hardware components may also initiate communications with input or output devices, and may operate on a resource (e.g., a collection of information).

The various operations of example methods described herein may be performed, at least partially, by one or more processing elements that are temporarily configured (e.g., by software) or permanently configured to perform the relevant operations. Whether temporarily or permanently configured, such processing elements may constitute processing element-implemented modules that operate to perform one or more operations or functions. The modules referred to herein may, in some example embodiments, comprise processing element-implemented modules.

Similarly, the methods or routines described herein may be at least partially processing element-implemented. For example, at least some of the operations of a method may be performed by one or more processing elements or processing element-implemented hardware modules. The performance of certain of the operations may be distributed among the one or more processing elements, not only residing within a single machine, but deployed across a number of machines. In some example embodiments, the processing elements may be located in a single location (e.g., within a home environment, an office environment or as a server farm), while in other embodiments the processing elements may be distributed across a number of locations.

Unless specifically stated otherwise, discussions herein using words such as "processing," "computing," "calculating," "determining," "presenting," "displaying," or the like may refer to actions or processes of a machine (e.g., a computer with a processing element and other computer hardware components) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

The patent claims at the end of this patent application are not intended to be construed under 35 U.S.C. § 112(f) unless traditional means-plus-function language is expressly recited, such as "means for" or "step for" language being explicitly recited in the claim (s).

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. A device for measuring a property of a substrate having a top surface, the device comprising:
an enclosure defining a cavity for placing the substrate;
two or more resonators extending into the cavity of the enclosure; and
two or more probes extending into the cavity, each of the two or more probes comprising a loop that extends about an axis that is substantially parallel to the top surface of the substrate so that the two or more probes are operable to excite a transverse magnetic mode signal in the cavity.

2. The device of claim 1, wherein the enclosure comprises an upper portion spaced apart from a lower portion.

3. The device of claim 2, further comprising a fastener extending between the upper portion and the lower portion of the enclosure and operable to adjust a distance between the upper portion and the lower portion.

4. The device of of claim 2, wherein the upper portion comprises an upward extending cylinder defining a cylindrical upper space of the cavity, and the lower portion comprises a downward extending cylinder defining a cylindrical lower space of the cavity.

5. The device of claim 1, wherein the enclosure comprises two or more channels for receiving the two or more probes.

6. The device of claim 1, wherein the enclosure comprises supports for supporting the two or more resonators in the cavity.

7. The device of claim 6, wherein the supports are made of dielectric material.

8. The device of claim 1, wherein the two or more resonators comprise dielectric resonators.

9. The device of claim 1, wherein the enclosure defines a gap for receiving the substrate into the cavity.

10. The device of claim 1, wherein the substrate is inhomogeneous.

11. The device of claim 1, wherein the property is an effective permittivity of the substrate.

12. The device of claim 1, wherein the property is a loss tangent of the substrate.

13. A method of measuring a property of a substrate, the method comprising:

exciting a transverse-magnetic mode signal, via two or more loop probes that extend about axes that are parallel to a top surface of the substrate, in an enclosure containing the substrate;
detecting, via two or more dielectric resonators, a responsive signal in the enclosure; and
determining the property of the substrate based at least in part on the responsive signal.

14. The method of claim 13, wherein the responsive signal is an adjusted responsive signal, further comprising
exciting the transverse-magnetic mode signal, via the two or more loop probes, in the enclosure without the substrate;
detecting, via the two or more dielectric resonators, a base responsive signal in the enclosure without the substrate; and
determining a base resonant frequency and a base Q-factor of the enclosure based at least in part on the base responsive signal.

15. The method of claim 14, further comprising determining an adjusted resonant frequency and an adjusted Q-factor based at least in part on the adjusted responsive signal.

16. The method of claim 15, wherein an effective permittivity and loss tangent of the substrate are determined based at least in part on the base resonant frequency, the base Q-factor, the adjusted resonant frequency, and the adjusted Q-factor.

17. A system for measuring an effective permittivity and loss tangent of a inhomogeneous substrate having a top surface, the system comprising:
an enclosure defining a cavity for placing the substrate;
two or more resonators extending into the cavity of the enclosure;
two or more probes extending into the cavity, each of the two or more probes comprising a loop that extends about an axis that is substantially parallel to the top surface of the substrate;
a network analyzer in communication with the two or more resonators, the network analyzer being configured to-
excite a transverse-magnetic mode signal, via the two or more probes, in the cavity, and
detect, via the two or more resonators, a responsive signal in the enclosure; and
a processing element in communication with the network analyzer and configured to determine the effective permittivity and the loss tangent of the substrate based at least in part on the responsive signal.

18. The system of claim 17, wherein the network analyzer is configured to determine a resonant frequency and a Q-factor of the enclosure based at least in part on the responsive signal, and the processing element is configured to determine the effective permittivity and the loss tangent of the substrate based at least in part on the resonant frequency and the Q-factor of the enclosure.

19. The system of claim 17, wherein the enclosure comprises an upper portion spaced apart from a lower portion.

20. The system of claim 19, further comprising a fastener extending between the upper portion and the lower portion of the enclosure and operable to adjust a distance between the upper portion and the lower portion.

21. The system of claim 19, wherein the upper portion comprises an upward extending cylinder defining a cylindrical upper space of the cavity, and the lower portion comprises a downward extending cylinder defining a cylindrical lower space of the cavity.

22. The system of claim 17, wherein the enclosure comprises two or more channels for receiving the two or more probes.

23. The system of claim 17, wherein the enclosure comprises supports for supporting the two or more resonators in the cavity.

24. The system of claim 23, wherein the supports are made of dielectric material.

25. The system of claim 17, wherein the two or more resonators comprise dielectric resonators.

26. The system of claim 17, wherein the enclosure defines a gap for receiving the substrate into the cavity.

\* \* \* \* \*